(12) United States Patent
Lee et al.

(10) Patent No.: US 9,459,286 B2
(45) Date of Patent: Oct. 4, 2016

(54) LARGE-AREA PROBE CARD AND METHOD OF MANUFACTURING THE SAME

(71) Applicant: GigaLane Co., Ltd., Hwaseong-si (KR)

(72) Inventors: Kyu Han Lee, Yongin-si (KR); Hee Seok Jung, Hwaseong-si (KR)

(73) Assignee: GIGALANE CO., LTD., Hwaseong-Si (KR)

( * ) Notice: Subject to any disclaimer, the term of this patent is extended or adjusted under 35 U.S.C. 154(b) by 302 days.

(21) Appl. No.: 14/463,056

(22) Filed: Aug. 19, 2014

(65) Prior Publication Data

US 2015/0054541 A1    Feb. 26, 2015

(30) Foreign Application Priority Data

Aug. 26, 2013  (KR) .......................... 10-2013-0101346

(51) Int. Cl.
*G01R 1/04* (2006.01)
*G01R 1/073* (2006.01)
*G01R 3/00* (2006.01)

(52) U.S. Cl.
CPC ......... *G01R 1/07342* (2013.01); *G01R 1/0408* (2013.01); *G01R 1/07378* (2013.01); *G01R 3/00* (2013.01); *Y10T 29/49002* (2015.01)

(58) Field of Classification Search
CPC .... G01R 1/04; G01R 1/073; G01R 1/07378; G01R 1/07342; G01R 1/0408; G01R 3/00; G01R 31/2889; G01R 1/067; G01R 1/06727; G01R 31/02; Y10T 29/49002
See application file for complete search history.

(56) References Cited

U.S. PATENT DOCUMENTS

| | | | |
|---|---|---|---|
| 2011/0221465 A1* | 9/2011 | Lee ..................... | G01R 1/07342 324/756.03 |
| 2013/0265073 A1* | 10/2013 | Nakano .................... | G01R 3/00 324/754.07 |
| 2013/0342232 A1* | 12/2013 | Park ................... | G01R 1/07342 324/750.16 |

FOREIGN PATENT DOCUMENTS

| | | |
|---|---|---|
| KR | 200416956 Y1 | 5/2006 |
| KR | 100858531 B1 | 9/2008 |
| KR | 101229233 B1 | 1/2013 |

\* cited by examiner

*Primary Examiner* — Son Le
(74) *Attorney, Agent, or Firm* — Polsinelli PC

(57) ABSTRACT

A large-area probe card and method of manufacturing the same including an insulation plate including at least one contactor formed thereon, a main substrate disposed below the insulation plate, and a flexible signal connector vertically passing through the insulation plate and disposed between the at least one contactor and the main substrate to electrically connect the at least one contactor with the main substrate.

8 Claims, 3 Drawing Sheets

LARGE-AREA PROBE CARD AND METHOD OF MANUFACTURING THE SAME

CROSS-REFERENCE TO RELATED APPLICATION

This application claims priority to Korean Patent Application Number 10-2013-0101346 filed Aug. 26, 2013, the disclosure of which is hereby incorporated in its entirety by reference.

BACKGROUND OF THE INVENTION

1. Field of the Invention

Disclosed embodiments relate to a large-area probe card, and more particularly to a large-area probe card and a method of manufacturing the same, which can improve flatness of the probe card and solve problems relating to a connecting structure between contactors and a main substrate.

2. Description of the Related Art

A semiconductor device is typically manufactured through a fabrication process in which circuit patterns and contact pads for inspection of a circuit are formed on a wafer and an assembly process in which the wafer including the circuit patterns and the contact pads formed thereon are assembled into individual semiconductor chips.

Between the fabrication process and the assembly process, an inspection process is performed for inspecting electrical properties by applying an electrical signal to the contact pads formed on the wafer. The inspection process is intended to inspect defects of wafers and remove defective wafers during the assembly process.

In the inspection process, an inspection instrument for applying electrical signals to a wafer, which is called a tester, and another inspection instrument fulfilling a function of an interface between the wafer and the tester, which is called a probe card, are dominantly used. The probe card includes a printed circuit board for receiving electrical signals and a plurality of probes adapted to come into contact with contact pads formed on the wafer.

In recent years, with the increase in demands for highly integrated semiconductor chips, circuit patterns which are formed on the wafer through the fabrication process are highly integrated, thus resulting in a reduced pitch interval between adjacent contact pads.

In order to inspect contact pads having a fine pitch, probes of a probe card have to be configured to also have a fine pitch. Consequently, the so-called space transformer, which is designed to compensate for the difference between the spacing of terminals on a printed circuit board and the spacing of probes, is provided between the printed circuit board and the probes.

A conventional probe card includes a printed circuit board, an interposer, a space transformer and probes. The printed circuit board includes probe circuit patterns which are formed for the inspection process, and function to receive electrical signals applied from a tester and transfer the electrical signals to the probes.

The interposer is connected to the probe circuit patterns of the printed circuit board, and functions to electrically connect the probes to the printed circuit board.

The space transformer can fulfill a function of pitch transformation by virtue of the configuration in which a spacing (pitch) of first pads is smaller than a spacing (pitch) of second pads.

In this context, the space transformer is made of a multi-layer ceramic (MLC), and transfers electrical signals, which are received from a printed circuit board, to probes through a conductive layer formed therein.

The multi-layer ceramic substrate is manufactured by alternately forming conductive layers and insulation layers on an insulation substrate multiple times. However, because the conventional space transformer is manufactured by alternately overlapping conductive layers and insulation layers multiple times, it results in a long and complicated manufacturing process, thus increasing manufacturing costs.

A space transformer undergoes thermal expansion or contraction under high or low temperature test conditions, but a conventional probe card does not use an alignment device, thus a misalignment between a probe block containing probes and the space transformer occurs. Consequently, this causes incorrect results when testing the electrical properties of semiconductor devices.

Furthermore, in conventional cases, when the number of probe pins increases due to the reduction of the pitch of semiconductor devices, the total size of the probe card increases and thus the spatial conditions are constricted.

SUMMARY OF THE INVENTION

Accordingly, disclosed embodiments keep in mind the above problems occurring in the prior art, and an object thereof is to provide a large-area probe card which is manufactured in such a way that a slit is formed in an insulation plate including contactors formed thereon, a flexible circuit board is fitted into the slit, one end of the flexible circuit board is electrically connected to the contactors and the other end of the flexible circuit board is electrically connected to a main substrate thus improving flatness of the probe card in order to solve the structural problems caused by use of the conventional interposer.

Another object of disclosed embodiments is to provide a large-area probe card in which shapes and lengths of patterns can be variably designed depending on the conditions of contactors thus offering realization of fine pitch.

Disclosed embodiments may provide a large-area probe card including: an insulation plate including at least one contactor formed thereon; a main substrate disposed below the insulation plate; and a flexible signal connector vertically passing through the insulation plate and disposed between the at least one contactor and the main substrate to electrically connect the at least one contactor with the main substrate.

The insulation plate may be made of a ceramic substrate. The signal connector may include a slit vertically formed in the insulation plate, and a flexible circuit board fitted in the slit, one end of which is electrically connected to the at least one contactor and the other end of which is electrically connected to the main substrate.

The flexible circuit board may serve as a space transformer for compensating the difference between a pitch of the at least one contactor and a pitch of pads of the main substrate.

The insulation plate may include a contactor mounting region and an edge region surrounding the contactor mounting region and constituting a periphery of the insulation plate, and the slit may be formed on the contactor mounting region.

The slit may have a predetermined length along a length of the at least one contactor and may be arranged along the circumference of the at least one contactor.

When the at least one contactor is provided in plural number, the slit may be formed for each of the plural number of contactors. The slits may be provided in plural number, and the plural number of slits may be formed in a width direction with spacings therebetween.

The slit may have a width of 2 mm to 3 mm and a length corresponding to a total length of one to three contactors.

Another disclosed embodiment provides a method of manufacturing a large-area probe card, including: forming contactors on an insulation plate; disposing a main substrate below the insulation plate; and vertically passing a signal connector through the insulation plate and electrically connecting contactors to the main substrate.

The insulation plate may be made of a ceramic substrate. The electrical connection of the contractors and the main substrate may include forming a slit vertically passing through the insulation plate, fitting a flexible circuit substrate into the slit, and electrically connecting one end of the flexible circuit board to the contactors and the other end of the flexible circuit board to the main substrate.

The flexible circuit board may serve as a space transformer compensating for the difference between a pitch of the at least one contactor and a pitch of pads of the main substrate.

The insulation plate may include a contactor mounting region and an edge region surrounding the contactor mounting region and constituting a periphery of the insulation plate, and the slit may be formed on the contactor mounting region.

The slit may be arranged along a length of the at least one contactor and may have a predetermined length along the length of the at least one contactor.

The at least one contactor may be provided in plural number, and the slit may be formed for each of the plural number of contactors.

The slits may be provided in plural number, and the plural number of slits may be formed in a width direction with spacings therebetween. The slit may have a width of 2 mm to 3 mm and a length corresponding to a total length of one to three contactors.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, a large-area probe card and a method of manufacturing the same is described in detail with reference to the attached drawings.

In this description, a structure of the large-area probe card is concomitantly described in the description of the method of manufacturing the large-area probe card.

Preparation of Insulation Plate

Figure 1:
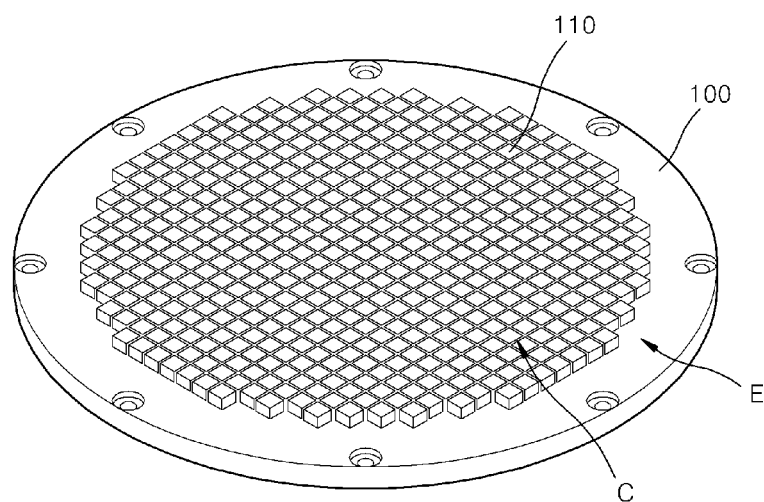
FIG. 1 is a perspective view showing an insulation plate according to disclosed embodiments.

FIG. 1 is a perspective view showing an insulation plate.

The insulation plate 100 as shown in FIG. 1 is provided. The insulation plate 100 is made of a ceramic substrate, and is configured to have a disc shape. Hereinafter, the insulation plate 100 is referred to as a ceramic substrate.

The ceramic substrate 100 includes a contactor mounting region C positioned at the central area thereof and an edge region E surrounding the contactor mounting region C.

In this context, the edge region E is formed on the periphery of the insulation plate 100.

The contactors 110, which are structures equipped with contact pins 111, are previously mounted on the contactor mounting region C.

The contactors 110 function to come into contact with contact terminals of an electrical test object and to acquire electrical signals. One contactor 110 may be provided with a predetermined number of contact pins 111 (for example, one hundred contact pins), and the number of the contactors 110 may vary depending on a width and a length of slits formed on the insulation plate 100.

The number of contactors 110 provided may be, for example, 100 or more. If one contactor 110 is provided with one hundred contact pins 111, one probe card is provided with 10,000 contact pins 111, thus allowing for test of 10,000 contact terminals.

Disposition of Main Substrate

Figure 2:
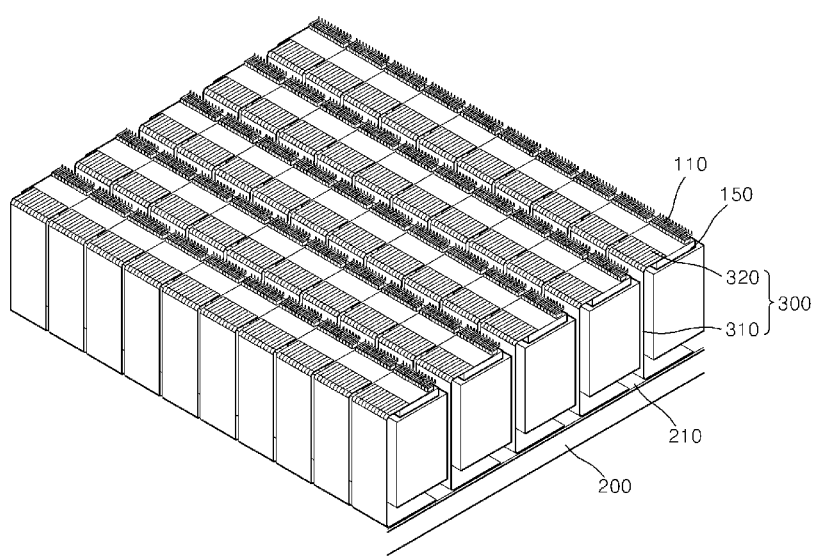
FIG. 2 is a cut-away perspective view showing the probe card according to disclosed embodiments.
Figure 3:
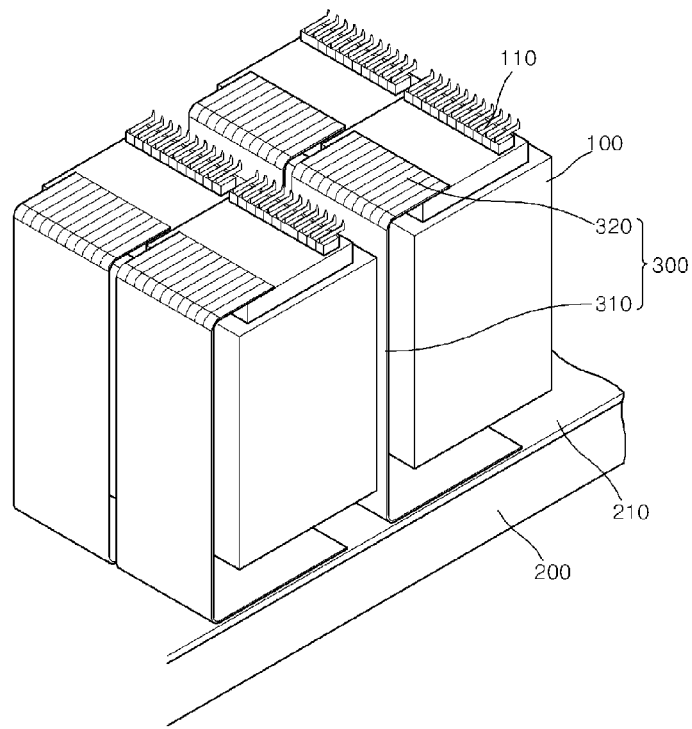
FIG. 3 is another perspective view showing the probe card according to disclosed embodiments.
Figure 4:
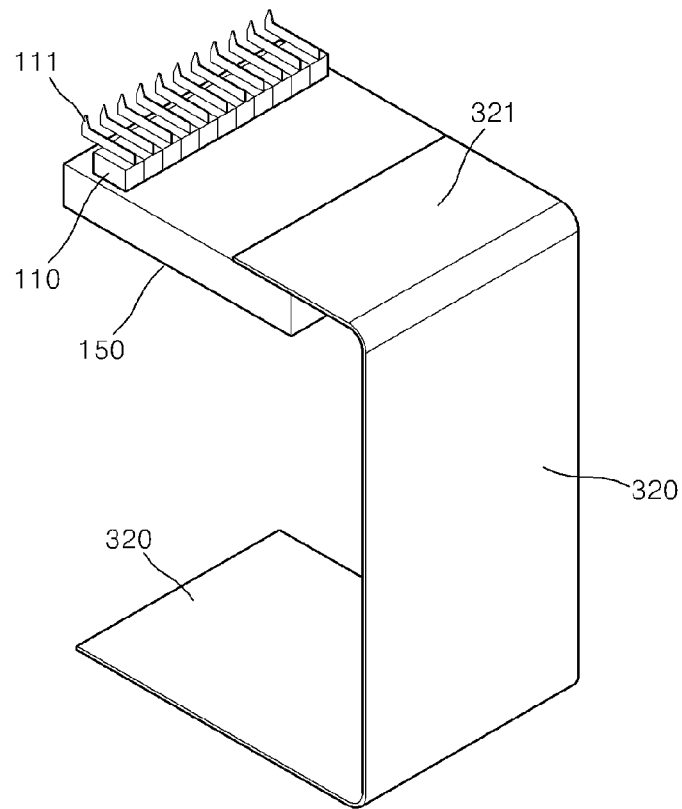
FIG. 4 is a perspective view showing connection between the contactors according to disclosed embodiments and a flexible circuit board.
Figure 5:
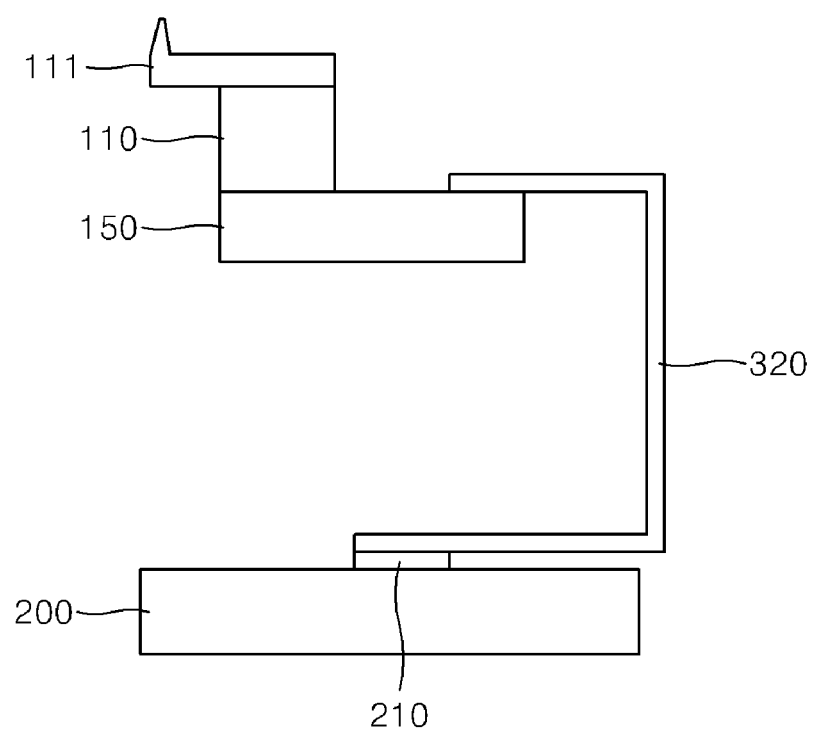
FIG. 5 is a cross-sectional view shown connection between the contactors according to disclosed embodiments and a signal connector.

FIG. 2 is a cut-away perspective view showing a probe card, FIG. 3 is another perspective view showing the probe card, FIG. 4 is a perspective view showing connection between the contactors 110 and a flexible circuit board, and FIG. 5 is a cross-sectional view showing connection between the contactors and a signal connector.

Referring to FIGS. 2 and 3, a main substrate 200 is provided. The main substrate 200 is preferably positioned below the ceramic substrate 100.

The main substrate 200 is provided thereon with pads 210 which are electrically connected to respective contactors 110 via the signal connector 300 that will be described hereinafter.

The pads 210 may be electrodes when the main substrate 200 is a circuit board, and may be contact tips when the main substrate 200 is an interposer.

Connection of Signal

As shown in FIGS. 2 and 3, slits 310 are formed in the ceramic substrate 100.

It is preferred that the slits 310 are formed such that the slits vertically pass through the ceramic substrate 100.

In an embodiment, the slits 310 are proved in a plural number. For example, the slits 310 may be formed in plural rows in the ceramic substrate 100 such that the slits 310 are arranged along the circumference and the length of the contactors 110.

In this context, the slits 310 are preferably positioned within the contactor mounting region C of the ceramic substrate 100.

Consequently, the region which is not provided with the slits 310 is the edge region E.

As a result, a process of forming the slits 310 may be simplified. More specifically, the process of forming the slits 310 can be conveniently carried out by cutting the contactor mounting region C, at a location other than the edge region E, in a line. This process performed in this way is preferably used when the number of the contactors 110 is 100 or less.

When the number of the contactors 110 is 100 or less, it is possible to eliminate problems such as thermal expansion or heat contraction of the ceramic substrate 100 caused by heat generated or removed during operation of the probe card.

When the number of the contactors 110 is 100 or more, the length of each of the slits 310 is preferably limited to a predetermined value.

More specifically, when the number of the contactors 110 is 100 or more, the contactor mounting region C is not cut in a line but the length of each of the slits 310 is determined within a total length of one to three contactors 110. The length which is determined in this way is referred to as a determined length.

Consequently, when the number of the contactors 110 is 100 or more, the slits are preferably formed such that a length of each of the slits 310 corresponds to the determined length.

In an embodiment, a width of each of the slits 310 is limited to 3 mm or less. More preferably, the width of each of the slits 310 is limited to a range of 1 mm to 3 mm. This is because an opening area of the ceramic substrate 100 is increased over a predetermined value and thus the ceramic substrate 100 cannot fulfill its inherent functions when a width of the slit 310 is 3 mm or more.

Referring to FIGS. 4 and 5, after the slits 310 are formed in the above-described way, the contactors 110 and the pads 210 of the main substrate 200 are electrically connected to each other.

The contactors 110 and the pads 210 of the main substrate 200 are thus flexibly connected to each other via the flexible circuit board 320.

The flexible circuit board 320 which is provided with electrical patterns 321 is prepared.

The prepared flexible circuit board 320 is fitted in each of slits 310.

As a result, one end of the flexible circuit board 320 is positioned on the top of the ceramic substrate 100 and the other end of the flexible circuit board 320 is positioned below the ceramic substrate 100.

The patterns 321 which are formed on the one end of the flexible circuit board 320 are electrically connected to respective contact pins 111.

At this point, the patterns 321 formed on the one end of the flexible circuit board 320 may be connected to connecting terminals of the contact pins 111 via a space transformer 150 if necessary. In this connecting operation, various connecting processes such as soldering, anisotropically-conductive film and anisotropically-conductive paste may be used.

When the space transformer 150 is provided, the space transformer 150 is positioned under the contactors 110. The space transformer 150 is provided on an upper surface thereof with conductive patterns which have the same pitch as the pitch between the contact pins 111. Ends of one side of the conductive patterns are in contact with the respective contact pins 111 and ends of the other side of the conductive patterns have a pitch larger than the pitch of the contact pins 111 and are connected to the patterns 321 of the flexible circuit board 320.

In some cases, the flexible circuit board 320 may be directly connected to the contact pins 111 formed on a bottom surface of the contactors 110 without the space transformer 150.

The other end of the flexible circuit board 320 is electrically connected to the corresponding pad 210 of the main substrate 200.

In this way, the contactors 110 are electrically connected to the main substrate 220 via the flexible circuit board 320.

The flexible circuit board 320 according to disclosed embodiments can fulfill the function of conventional space conversion. Specifically, the flexible circuit board 320 can serve as a space transformer compensating for the difference between the pitch of the contact pins 111 and the pitch of the pads 210 of the main substrate 200 by changing shapes of the patterns 321 formed on the flexible circuit board 320 or by making lengths of the patterns different from each other.

In the function of the space conversion, a conventional technology has a disadvantage in that misalignment between the ceramic substrate 100 and the main substrate 200 is apt to occur, but disclosed embodiments can substantially exclude possibility of the misalignment by virtue of flexibility of the flexible circuit board 320 serving as a space transformer.

As described above, disclosed embodiments provide a probe card and a method of manufacturing the same which is manufactured in the above-described way. The probe card may be implemented in such a way that slits are formed in an insulation plate on which contactors are formed, flexible circuit boards are fitted in the slits, the contactors are electrically connected to ends of one side of the flexible circuit boards, and ends of the other side of the flexible circuit boards are connected to a main substrate. As a result, disclosed embodiments can provide improved flatness of the probe card and can solve the conventional structural problems caused by use of the interposer.

Furthermore, shapes and lengths of the patterns formed on the flexible circuit board can be variably designed according to conditions of contactors, thus allowing easy realization of fine pitch.

In addition, since the flexible circuit board is provided between the contactor and the main substrate for space conversion, production costs required to install an interposer can be reduced and stress changes caused by installation of the interposer can be fundamentally eliminated.

Furthermore, since the flexible circuit board is lighter than the interposer, the weight of the resulting probe card can be reduced.

In addition, when patterns are formed on the flexible circuit board, shapes and lengths of the patterns can be variably controlled depending on resistance of path from the contactors.

Furthermore, since disclosed embodiments use the flexible circuit board for the space conversion, a multilayer structure can be realized between the ceramic substrate and the main substrate. Consequently, even if a plurality of contactors having different pitches is used, disclosed embodiments allow for realization of a fine pitch and accommodation of various production conditions.

As described above, a probe card may be constructed in such a way that a slit is formed in an insulation plate including contactors formed thereon, a flexible circuit board is fitted into the slit, one end of the flexible circuit board is electrically connected to the contactors and the other end of the flexible circuit board is electrically connected to a main substrate thus improving a flatness of the probe card, whereby the structural problems caused by use of the conventional interposer are solved.

Furthermore, the present invention provides advantages in that shapes and lengths of patterns can be variably designed depending on the conditions of contactors thus allowing realization of fine pitch.

Since the probe card does not use an interposer, production cost of the probe card is inexpensive relative to a conventional probe card. Since there is no stress of the probe card caused by the interposer, the weight of a stiffener can be reduced. Furthermore, expensive ceramic substrates such as MLC and MLS are not used as an insulation substrate, thus disclosed embodiments have improved price competiveness.

In addition, when patterns (electrodes) for the signal transfer are formed on a flexible circuit board, shapes and lengths of the patterns can be variably controlled depending on total resistance of path from the contactors.

Furthermore, if the width and the length of slits formed on the insulation plate are reduced while the flexible circuit board is applied in plural numbers, a very fine pitch can be freely realized even in a large-area multi-layer probe card.

Although preferred embodiments of the present invention have been disclosed with reference to the accompanying drawings, it is to be understood that the present invention is not limited the embodiments and can be manufactured into various configurations. It is further understood by those skilled in the art that various modifications, additions and substitutions are possible, without departing from the scope and spirit of the invention as disclosed in the accompanying claims. Accordingly, it is to be understood that the above-described embodiments are illustrative and not restrictive.

What is claimed is:

1. A large-area probe card comprising:
    an insulation plate including at least one contactor;
    a main substrate disposed below the insulation plate; and
    a flexible signal connector vertically passing through the insulation plate and disposed between the at least one contactor and the main substrate to electrically connect the at least one contactor with the main substrate,
    wherein the signal connector comprises:
        a slit vertically formed in the insulation plate; and
        a flexible circuit board fitted in the slit, one end of which is electrically connected to the at least one contactor and the other end of which is electrically connected to the main substrate.

2. The large-area probe card according to claim 1, wherein the insulation plate comprises a ceramic substrate.

3. The large-area probe card according to claim 1, wherein the flexible circuit board serves as a space transformer compensating for the difference between a pitch of the at least one contactor and a pitch of pads of the main substrate.

4. The large-area probe card according to claim 1, wherein the insulation plate includes a contactor mounting region and an edge region surrounding the contactor mounting region and constituting a periphery of the insulation plate, and
    wherein the slit is formed on the contactor mounting region.

5. The large-area probe card according to claim 1, wherein the slit is arranged along the circumference and a length of the at least one contactor and has a predetermined length along the length of the at least one contactor.

6. The large-area probe card according to claim 5, wherein the at least one contactor is provided in plural number, and the slit is formed for each of the plural number of contactors.

7. The large-area probe card according to claim 6, wherein the slit is provided in plural number, and the plural number of slits are formed in a width direction with spacings therebetween.

8. The large-area probe card according to claim 6, wherein the slit has a width of 2 mm to 3 mm and a length corresponding to a total length of one to three contactors.

* * * * *